United States Patent
Lane et al.

(10) Patent No.: US 9,472,379 B2
(45) Date of Patent: Oct. 18, 2016

(54) METHOD OF MULTIPLE ZONE SYMMETRIC GAS INJECTION FOR INDUCTIVELY COUPLED PLASMA

(71) Applicant: Applied Materials, Inc., Santa Clara, CA (US)

(72) Inventors: Steven Lane, San Jose, CA (US); Yang Yang, Los Gatos, CA (US); Kartik Ramaswamy, San Jose, CA (US); Lawrence Wong, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 22 days.

(21) Appl. No.: 14/310,969

(22) Filed: Jun. 20, 2014

(65) Prior Publication Data

US 2015/0371824 A1    Dec. 24, 2015

(51) Int. Cl.
*C23F 1/00* (2006.01)
*H01J 37/32* (2006.01)

(52) U.S. Cl.
CPC ........ *H01J 37/3211* (2013.01); *H01J 37/3244* (2013.01); *H01J 37/32165* (2013.01); *H01J 2237/332* (2013.01); *H01J 2237/334* (2013.01)

(58) Field of Classification Search
CPC .......... H01J 37/3222; H01J 37/32091; H01J 37/3211; H01J 37/32798; H01J 37/321; H01J 37/3234; H01J 37/3244

USPC .......... 156/345.38, 345.44, 345.48; 438/706, 438/710, 712, 714, 720, 729
See application file for complete search history.

(56) References Cited

U.S. PATENT DOCUMENTS

| | | | |
|---|---|---|---|
| 2006/0105104 A1* | 5/2006 | Tada ................. | C23C 16/45565 427/248.1 |
| 2007/0013284 A1* | 1/2007 | Lee ......................... | H01J 27/16 313/231.31 |
| 2008/0122367 A1* | 5/2008 | Vinogradov .......... | H01J 37/321 315/111.21 |
| 2009/0294065 A1* | 12/2009 | Lai ..................... | H01J 37/3244 156/345.47 |
| 2012/0103523 A1* | 5/2012 | Iizuka .................. | H01J 37/321 156/345.27 |

* cited by examiner

*Primary Examiner* — Lan Vinh
(74) *Attorney, Agent, or Firm* — Patterson & Sheridan, LLP

(57) ABSTRACT

Implementations described herein inject feedstock gases into multiple zones of an inductively coupled plasma processing reactor with minimal or no effect on process skew. In one embodiment, an integrated gas and coil assembly is provided that includes an upper surface and a lower surface, a first RF field applicator coil bounded at the upper surface and the lower surface, a second RF field applicator coil circumscribed by the first RF field applicator coil and bounded at the upper surface and the lower surface and an RF shield disposed between the first and second RF field generator wherein the RF shield extends from the lower surface and past the upper surface. The RF shield may have at least one gas channel disposed therethrough.

20 Claims, 7 Drawing Sheets

METHOD OF MULTIPLE ZONE SYMMETRIC GAS INJECTION FOR INDUCTIVELY COUPLED PLASMA

BACKGROUND

1. Field

Implementations described herein generally relate to semiconductor manufacturing and more particularly to a method and apparatus for delivering feedstock gases in multiple zone inductively coupled plasma reactors and the like.

2. Description of the Related Art

As the feature size of the device patterns get smaller, the critical dimension (CD) requirements of these features become a more important criterion for stable and repeatable device performance. Allowable CD variation across a substrate processed within a processing chamber is difficult to achieve due to chamber asymmetries such as chamber and substrate temperature, flow conductance, and RF fields.

A conventional inductively coupled plasma reactor has feedstock gases injected through a nozzle at the center of the dielectric window at the top of plasma reactor. The feedstock gas is injected through a metal gas line which runs underneath the coil, parallel to the dielectric window, to the nozzle located at the center of the dielectric window. This method allows for the gas to be symmetrically delivered to the reactor. However, as the metal pipe line is in the influence of a strong electromagnetic field from the coils, it develops an inductively or capacitively coupled voltage.

Traditional reactors only have gas injection at the center of the reactor. Although such reactors have robust performance histories at larger CD's, coupling of the voltage to the metal feedstock gas line during plasma processing affects the uniformity of the substrates processed in the chamber when processing state of the art small CD's. After coupling, evidence of the gas line may be printed on the substrate processing map. It is impractical to use a round hollow metal disc instead of a single gas line to deliver the gas as the round hollow metal disc will shield the RF field of the coils and inhibit production of the plasma in the chamber.

Therefore, there is a need for an improved method for delivering gas in an inductively coupled plasma processing reactor.

SUMMARY

Implementations described herein inject feedstock gases into multiple zones of an inductively coupled plasma processing reactor with minimal or no effect on process skew. In one embodiment, an integrated gas and coil assembly is provided that includes an upper surface and a lower surface, a first RF field applicator coil bounded at the upper surface and the lower surface, a second RF field applicator coil circumscribed by the first RF field applicator coil and bounded at the upper surface and the lower surface and an RF shield disposed between the first and second RF field generator wherein the RF shield extends from the lower surface and past the upper surface. The RF shield may have at least one gas channel disposed therethrough.

In another embodiment, a processing reactor is provided. The processing reactor includes chamber body having an electrostatic chuck (ESC) disposed in the chamber body and an integrated gas and coil assembly. The integrated gas and coil assembly may include an upper surface and a lower surface, a first RF field applicator coil bounded at the upper surface and the lower surface, a second RF field applicator coil circumscribed by the first RF field applicator coil and bounded at the upper surface and the lower surface and an RF shield disposed between the first and second RF field generator wherein the RF shield extends from the lower surface and past the upper surface. The RF shield may have at least one gas channel disposed therethrough.

In yet another embodiment, a method for processing a substrate in a plasma processing reactor is provided that includes injecting first gas through a center ground into the processing reactor, injecting secondary gases through a plurality of gas flooding channels into the processing reactor, applying power from a first power source to energize an inner RF coil, applying power from a second power source to energize an outer RF coil. The first gas, the secondary gases, the outer RF coil and the inner RF coil are isolated while a plasma is formed in the processing reactor.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

An apparatus and a method to inject feedstock gases into an inductively coupled plasma processing reactor while substantially avoiding introduction of process skews is provided. Some implementations described herein provide an integrated gas and coil assembly for an inductively coupled plasma reactor. The integrated gas and coil assembly may have a grounded isolator located between inner and outer coils. The grounded isolator electromagnetically shields the inner coil from the outer coil thereby substantially eliminating the electrical crosstalk and phase interactions between the two coils. In some implementations, reciprocal gas feeding channels may be disposed in the isolator. In still other implementations, the gas channels symmetrically feed gases into multiple nozzles that are azimuthally evenly distributed underneath the ground cylinder. The nozzles control the gas injection to inner and outer zones of the interior chamber volume.

Figure 1:
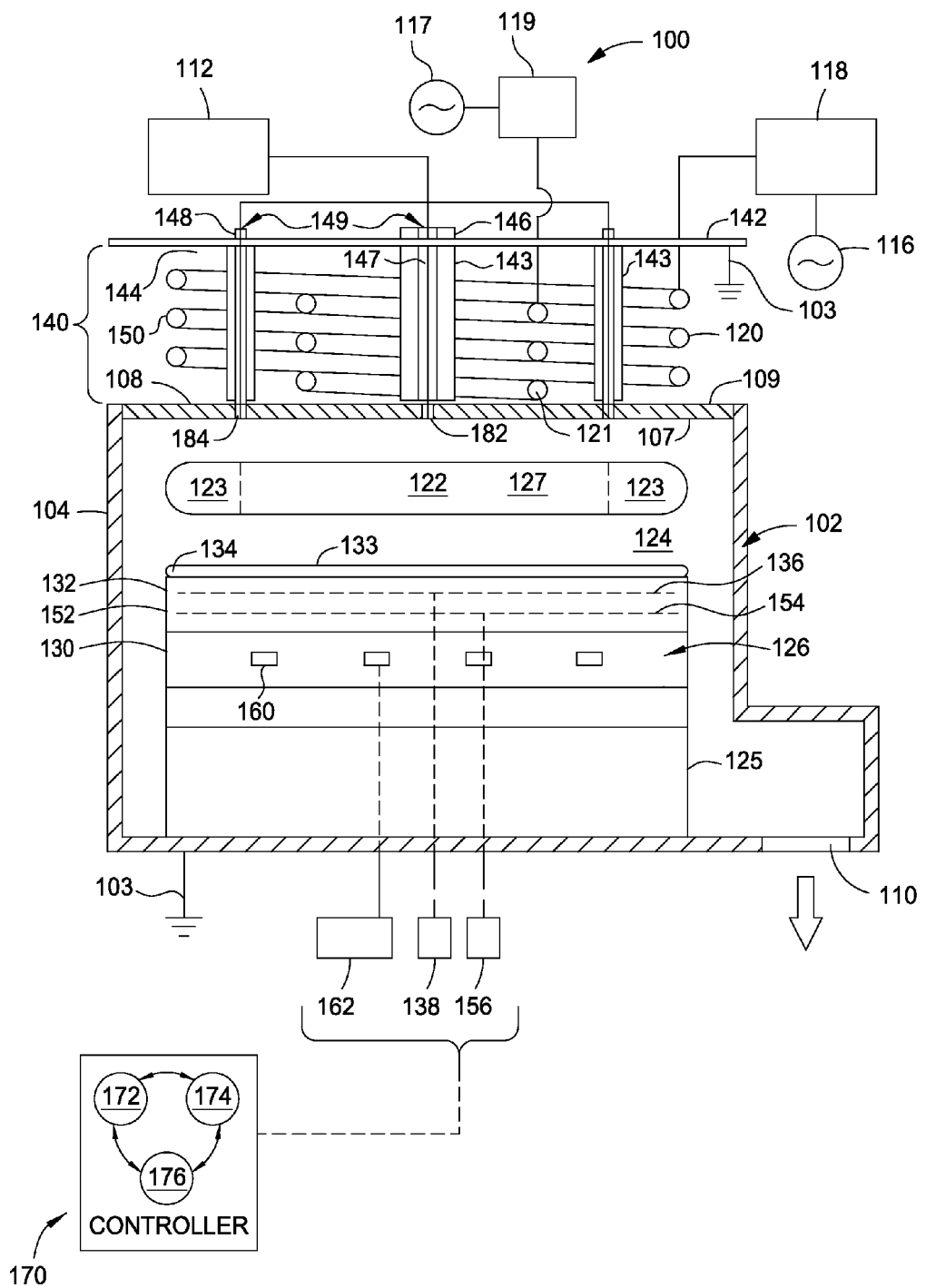
FIG. 1 is a cross-sectional schematic side view of a inductively coupled processing reactor having one embodiment of an integrated gas and coil assembly.

FIG. 1 is a cross-sectional schematic view of an exemplary plasma processing reactor 100 having an integrated gas and coil assembly 140. In one implementation, the plasma reactor 100 is configured as an etch reactor. As discussed above, the integrated gas and coil assembly 140 may be utilized in other processing reactors, for example plasma treatment chambers, physical vapor deposition chambers, chemical vapor deposition chambers, and ion implantation chambers, among other reactors where there is a need to inject feedstock gases into multiple zones of the plasma processing reactor.

The plasma reactor 100 includes a grounded chamber body 102. The chamber body 102 includes walls 104, a bottom 106 and a lid 108 which enclose an internal volume 124. The chamber body 102 is coupled to a ground 103.

The walls 104 of the plasma reactor 100 include an opening (not shown) through which the substrate 134 may be robotically transferred into and out of the internal volume 124. A pumping port 110 is formed in one of the walls 104 or the bottom 106 of the chamber body 102, and is fluidly connected to a pumping system (not shown). The pumping system is utilized to maintain a vacuum environment within the internal volume 124 of the plasma reactor 100, while removing processing byproducts.

The lid 108 of the plasma reactor 100 includes an upper surface 109 and a lower surface 107. The lower surface 107 of the lid 108 is exposed to the internal volume 124 of the processing reactor while the upper surface 109 of the lid 108 is exposed to the integrated gas and coil assembly 140. The lid 108 may act as a dielectric window allowing RF energy to pass therethrough while containing gases, plasma and heat in the internal volume 124 of the plasma reactor 100.

A substrate support assembly 126 is disposed in the internal volume 124. The substrate support assembly 126 may include an electrostatic chuck (ESC) 132 that secures a substrate 134 to the substrate support assembly 126 during processing. The substrate support assembly 126 may additionally include a heater assembly (not shown) and a cooling base 130. The cooling base 130 or heater assembly may alternately be separate from the substrate support assembly 126. The substrate support assembly 126 may be removably coupled to a support pedestal 125. The support pedestal 125 is mounted to the chamber body 102 to allow the substrate support assembly 126 to be periodically removed from the processing reactor 100 for refurbishment of one or more components of the substrate support assembly 126.

The temperature controlled cooling base 130 is coupled to a heat transfer fluid source 162. The heat transfer fluid source 162 provides a heat transfer fluid, such as a liquid, gas or combination thereof, which is circulated through one or more conduits 160 disposed in the cooling base 130. The fluid flowing through neighboring conduits 160 may be isolated to enable local control of the heat transfer between the ESC 132 and different regions of the cooling base 130. The local control of the heat transfer assists in controlling the lateral temperature profile of the substrate 134.

The ESC 132 may include one or more resistive heaters 154 embedded in a dielectric body 152. The resistive heaters 154 are coupled to a heater power source 156. The resistive heaters 154 may be provided to elevate the temperature of the substrate support assembly 126, and substrate 134 disposed thereon, to a temperature for conducting substrate processing.

The ESC 132 has a workpiece surface 133 upon which the substrate 134 may rest. The workpiece surface 133 of the ESC 132 may include gas passages (not shown) for providing backside heat transfer gas to the interstitial space defined between the substrate 134 and the workpiece surface 133 of the ESC 132. The ESC 132 may also include lift pin holes for accommodating lift pins (both not shown) for elevating the substrate 134 above the workpiece surface 133 of the ESC 132 to facilitate robotic transfer into and out of the plasma reactor 100.

The dielectric body 152 has one or more chucking electrodes 136 embedded therein. The chucking electrodes 136 may be configured as a bipolar electrode, or other suitable arrangement. The chucking electrode 136 is coupled through an RF filter to a chucking power source 138, which provides a RF or DC power to electrostatically secure the substrate 134 to the workpiece surface 133 of the ESC 132.

A controller 170 is coupled to the plasma reactor 100 to control operation of the plasma reactor 100 and processing of the substrate 134. The controller 170 may be one of any form of general-purpose data processing system that may be used in an industrial setting for controlling the various sub-processors and sub-controllers. Generally, the controller 170 includes a central processing unit (CPU) 172 in communication with memory 174 and input/output (I/O) circuitry 176, among other common components. Software commands executed by the CPU of the controller 170, cause the processing chamber to, for example, introduce feedstock gas mixtures (i.e., processing gas) into the internal volume 124, form the plasma 122 from the feedstock gas by application of RF power, and etch a layer of material present on the substrate 134.

A gas panel 112 provides the feedstock gases through the integrated gas and coil assembly 140 into the internal volume 124 of the plasma reactor 100. The integrated gas and coil assembly 140 may have a RF field applicator 150 comprised of one or more independent RF coils, such as inner RF coil 121 and outer RF coil 120. The integrated gas and coil assembly 140 may additionally have one or more gas passages 149, such as center gas channel 147 and outer gas channels 148. The integrated gas and coil assembly 140 may have one or more isolators 143 electrically bonded to a ground plate 142. The gas passages 149 may be formed through one or more of the isolators 143, i.e. RF shields. The isolators 143 may be a ceramic or other dielectric material which may electromagnetically shield or contain the RF energy used to maintain a plasma 122 in the plasma reactor 100. Alternately, the isolators 143 may be formed from an electrically conductive material, such as a metal, and electrically bonded to the ground plate 142 to shield the RF energy.

The isolators 143 may include one or more of an inner isolator 146 (shown as a center gas feed cylinder) and an outer isolator 144 (shown as a ground cylinder). It should be appreciated that one or both the inner isolator 146 and the outer isolator 144 is not necessarily a cylinder. One example wherein the outer isolator 144 is not a cylinder is discussed below in FIG. 4. The outer isolator 144 electromagnetically shields the inner and outer RF coils 121, 120 from each other such that the RF generated by the inner RF coils 121 does not influence, or is influenced by, the RF generated by the outer RF coils 120. The outer isolator 144 may be disposed between the inner and outer RF coils 121, 120 to prevent the cross transmission (crosstalk) of the RF energy emanating from either the inner or outer RF coils 121, 120 used for maintaining the plasma 122 within the internal volume 124 of the plasma reactor 100. The separation of the RF energy for maintaining the plasma between the inner and outer RF coils 121, 120 allows better control of the lateral distribution of plasma properties within the internal volume 124. For example, a center control zone 127 for the plasma 122 may predominantly be created in the internal volume 124 of the plasma reactor 100 that is associated (i.e., controlled) with the inner RF coil 121 and an outer control zone 123 for the plasma 122 may be created in the internal volume 124 of the plasma reactor 100 that is associated (i.e. controlled) with the outer RF coils 120.

The gas passages 149 may have multiple zones, such as those servicing the outer control zone 123 and the center control zone 127, for symmetrically injecting the feedstock gases into the internal volume 124 of the processing reactor 100. The gas passages 149 may include one or more gas channels 148, 147. The gas channels 148, 147 provide tune and control of the process by separately controlling the flow mass rate between the multiple zones, i.e., the center control zones 125 associated with center gas channel 147 and the outer control zones 123 associated with outer gas channels 148. The gas channels 148, 147 may be vertically formed through one or more of the inner or outer isolators 144, 146. In this manner, the isolators 143 protect the gas channels 148, 147 from the RF energy from the RF field applicator 150. Thus, preventing RF energy from the coils 121, 120 from inductively coupling with and forming a plasma from the feedstock gasses present in the gas channels 148, 147.

Feedstock gasses, supplied through the gas channels 148, 147 in the inner and outer isolators 144, 146, pass through nozzles and into the internal volume 124 of the plasma reactor 100 for forming the plasma 122 therein. The nozzles may include a center gas nozzle 182 and one or more outer gas nozzles 184. The center gas nozzle 182 and outer gas nozzles 184 are formed through the lid 108 of the chamber body 102. The outer gas nozzles 184 may be equally spaced, for example on a common radius extending from a center-line of the processing reactor 100, or formed in some other pattern which provides symmetrical distribution of the feedstock gases into the outer control zone 123 of the internal volume 124 of the plasma reactor 100.

The delivery of gas to the center control zone 127, i.e., the center gas channel 147 in the center gas feed cylinder (inner isolator 146), may be vertically aligned in the inner isolator 146 at the center of the dielectric window, i.e. lid 108. The center gas channel 147 connects with the center gas nozzle 182 and associated with the center control zone 127 of the internal volume 124 of the plasma reactor 100. The connector/fitting for coupling to the gas passages 149 may be formed of a metal material and disposed atop the gas feed cylinder, i.e. inner isolator 146, and is vertically above the ground plate 142, the inner RF coil 121 and away from the plasma 122. Therefore, electric field perturbation caused by the connections to the gas passages 149 in the process may be substantially eliminated.

The feedstock gases in the internal volume 124 of the plasma reactor 100 may be energized by RF power inductively coupled to the feedstock gases from the RF field applicator 150 positioned outside the chamber body 102. In the embodiment depicted in FIG. 1, the RF field applicator 150 is a pair of coaxial coils, the inner RF coil 121 and outer RF coil 120. The inner RF coil 121 is coupled through an inner coil matching circuit 119 to an inner coil RF power source 117. The inner coil RF power source 117 may provide RF power at one or more steady state or tunable frequencies. The outer RF coil 120 is coupled through an outer coil matching circuit 118 to an outer coil RF power source 116 may provide RF power at one or more steady state or tunable frequencies. The inner RF coil 121 and outer RF coil 120 are electromagnetically isolated and can be separately driven by the RF coil power sources 116, 117. Thus, the inner RF coil 120 and the outer RF coil 121 may be operated at similar or different RF frequencies with minimal crosstalk, thereby enhancing process control.

As discussed above, the feedstock gases provided by the gas panel 112 through the integrated gas and coil assembly 140 are energized within the internal volume 124 to form the plasma 122 utilized to process the substrate 134 disposed on the ESC 132. The integrated gas and coil assembly 140 prevents plasma from forming within the integrated gas and coil assembly 140 while providing symmetric distribution of the process gasses in the process reactor 100, thus reducing any contribution to potential process skew.

Figure 2:
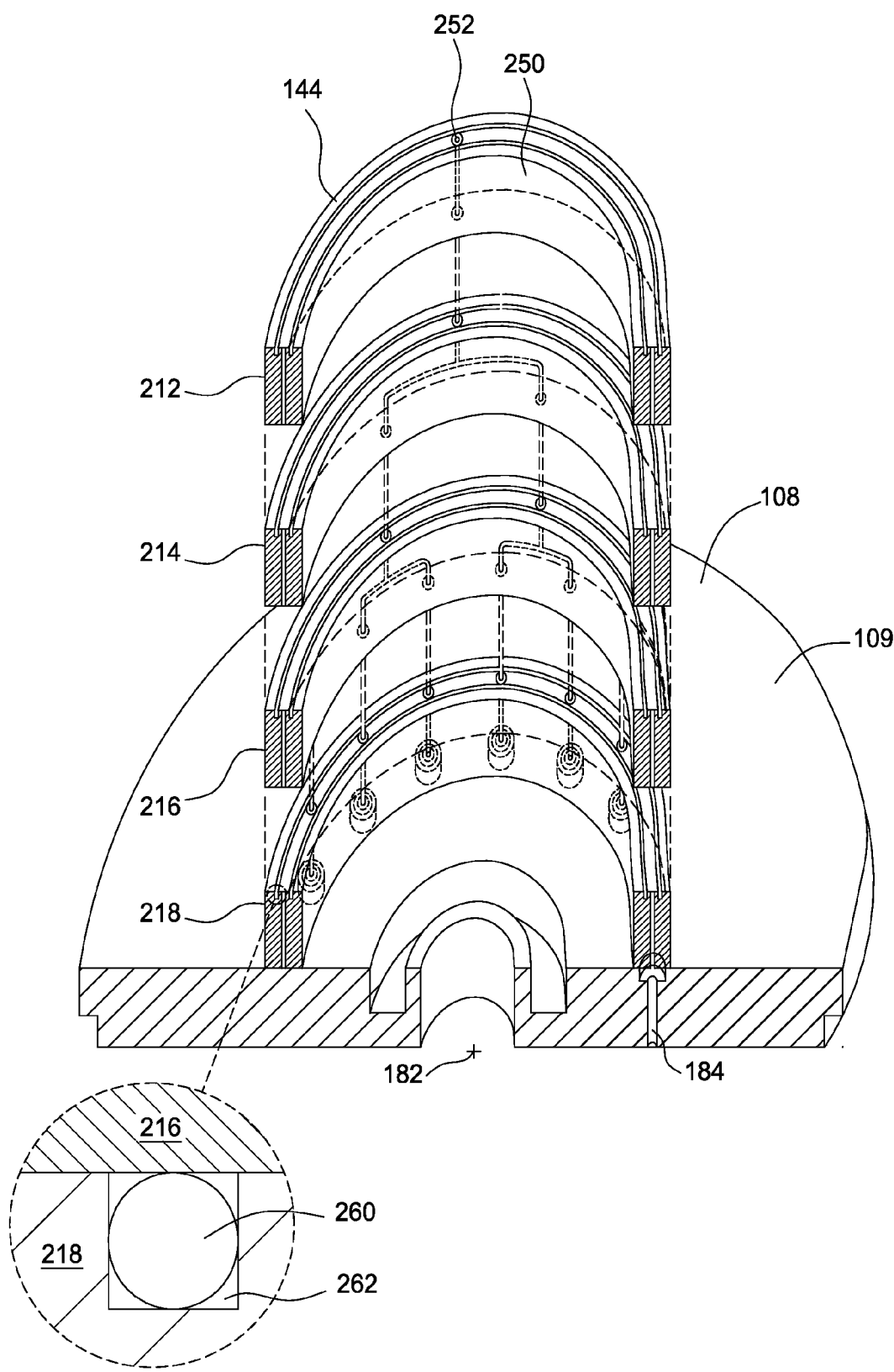
FIG. 2 illustrates an exploded partial isometric view for the integrated gas and coil assembly.

FIG. 2 illustrates an exploded partial isometric view of the integrated gas and coil assembly 140 disposed on the lid 108. The outer isolator 144 is also shown in FIG. 2 while the other chamber components have been removed.

In the embodiment of FIG. 2, the outer isolator 144 may be formed from a plurality of dielectric rings which act as an electromagnetic shield that interferes with the RF energy emanating from the inner and outer RF coils 121, 120 (shown in FIG. 1). For example, the plurality of dielectric rings of the outer isolator 144 may include a fourth isolator ring 218 disposed on the upper surface 109 of the lid 108, a third isolator ring 216 disposed on top of the fourth isolator ring 218, a second isolator ring 214 disposed on top of the third isolator ring 216, and a first isolator ring 212 disposed on top of the second isolator ring 214. An RF conductive gasket 260, such as a barium copper coil spring, may be disposed in a groove 262 formed in one or more adjacent surfaces of the rings to ensure good RF transmission therebetween. The ground plate 142 (shown in FIG. 1) may be disposed on top of the first isolator ring 212 and electrically bonded to the isolator rings 212, 214, 216, 218. By fabrication the outer isolator 144 out of multiple rings, eddy current formation is inhibited thereby reducing heat generation and parasitic power loss from the coils, 121, 120. Alternately, the outer isolator 144 may be formed from a single mass of material electrically bonded to the ground plate 142. The outer isolator 144 may be formed from a metal or suitable conductive material suitable of being electrically bonded to the ground plate 142. Alternately, the outer isolator 144 may be formed from a material comprising quartz, yttria, aluminum oxide, aluminum nitride or other dielectric material.

The material of the outer isolator 144 may be grounded or may have a dielectric strength sufficient to prevent the RF energy from penetrating the gas channels 148 disposed therein that symmetrically feed gases into the outer gas nozzles 184 that are azimuthally evenly distributed underneath the lid 108. The outer gas nozzles 184 controllably inject the feedstock gases into the outer control zone 123 of the internal volume 124 of the plasma reactor 100, i.e. those zones away from the center area of the internal volume 124. Grounding the inner and outer isolators 146, 144 prevent the gases in the gas channels 148 from becoming energized. Additionally, the outer isolator 144 prevents crosstalk between the RF energy emanating from the inner RF coil 121 and the RF energy emanating from the outer RF coil 120. The elimination of the crosstalk and phase interactions as well as different operational frequencies between the RF energy from the inner and outer RF coils 121, 120, provides better control of the RF coupling energy with the feedstock gases within the internal volume 124 of the process chamber.

In some embodiments, the gas channels 148 may form reciprocal (branching) gas feeding channels 250 enclosed inside the outer isolator 144. The gas feeding channels 250 splits a plurality of times to evenly distribute the gas exiting the outer isolator 144 and into the internal volume 124 of the plasma reactor 100.

Figure 3:
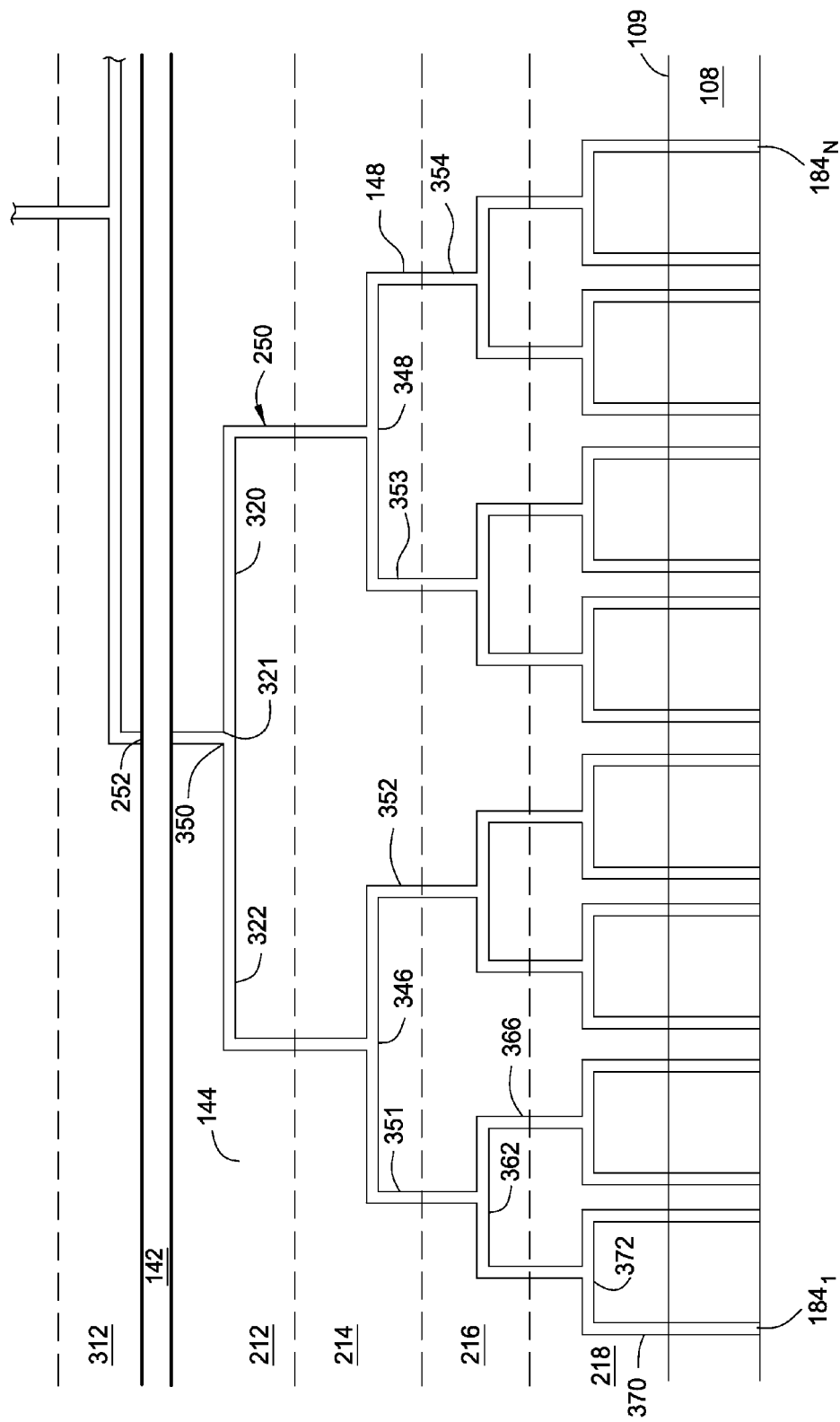
FIG. 3 illustrates a schematic diagram for a gas channel of the integrated gas and coil assembly.

Referring to the exemplary schematic for the gas channel 250 of the integrated gas and coil assembly 140 illustrated in FIG. 3, the first isolator ring 212 may have one or more inlets 252 for introducing the feedstock gases into a first portion 350 of the gas feeding channel 250. The first portion 350 of the gas feeding channel 250 may have a tee 321 which divides the gas flow between two pathways 320, 322 prior to the pathways 320, 322 of the gas feeding channel 250 entering the second isolator ring 214. In the second isolator ring 214, the first pathway 322 of the gas feeding channels 250 may have a tee 346 which divides the gas feeding channels 250 into pathways 351, 352, for entering into the third isolator ring 216. Additionally, in the second isolator ring 214, the second pathway 320 of the gas feeding channels 250 may have a tee 348 which divides the gas feeding channels 250 into pathways 353, 354 for entering into the third isolator ring 216. In the third isolator ring 216, the four pathways 351, 352, 353, 354 of the gas feeding channels 250 may each have a tee, such as tee 362, which further divides the gas feeding channels 250 into eight additional pathways substantially similar to pathway 366 for entering into the fourth isolator ring 218. In the fourth isolator ring 218, the eight pathways, substantially similar to pathway 366, of the gas feeding channels 250 may each have a tee such as tee 372 which divides the gas feeding channels 250 into sixteen pathways, such as pathway 370, which lead to the lid 108 and out the outer gas nozzles 184 for symmetrically injecting the gas into the internal volume 124 of the plasma reactor 100. In this arrangement, a number of nozzles $184$-$184_n$ may be selected by altering the number of isolator rings. In some embodiments, the number of isolator rings may even extend above the ground plate 142. For example, one or more isolator rings 312 may be disposed atop the ground plate 142 to assist in dividing the gas feeding channel 250. Thus, forming multiple inlets 252 for the gas feeding channels 250 in the first isolator ring 212 below the ground plate 142. Thus, the number of nozzles 184 introducing gas into the internal volume 124 of the plasma reactor 100 may be increased by a factor of two for each additional isolator ring above and below the ground plate 142 which form the outer isolator 144. Thus, the distribution of the gas into the internal volume 124 of the plasma reactor 100 may be controlled and made symmetric.

Returning to FIG. 2, grounded metal walls of the isolator rings 212, 214, 216, 218 forming the outer isolator 144 provide an RF field-free region which encloses the gas feeding channels 250. Thus, the gases in the gas feeding channels 250 will not form a plasma while in the outer isolator 144. Additionally, the RF field free region of the gas feeding channels 250 will not cause any electromagnetic perturbation which may affect processing of the substrate 134 in the plasma reactor 100. Thus, the gas may be delivered to the internal volume 124 of the plasma reactor 100 by the integrated gas and coil assembly 140 substantial without creating process skews that may affect substrates 134 processed therein.

Advantageously, gas delivery to the outer and center control zones 123, 125 of the internal volume 124 of the plasma reactor 100 may be utilized for tuning the substrate processing by controlling the flow mass rate between the respective zones. Additionally, the delivery of gas to the outer control zone 123 has no electromagnetic perturbation to the process while the perturbation due to the gas line delivering gas to the center control zone 127 is minimized. The metal gas line for the center control zone 127 is vertically above the ground plate 142. The gas line is also far away from the plasma 122 and above the strong electromagnetic field region. The process impact of the metal gas line connected to the center gas nozzle 182 is totally eliminated. An additional advantage is that the inner RF coil 121 and outer RF coil 120 are electromagnetically isolated and can be separately driven by different generators at different frequencies and/or power to provide better process control. Therefore, phase relationships between the inner RF coil 121 and outer RF coil 120 and the RF fields from the two RF coils 120, 121 do not constructively or deconstructively interfere to produce undesirable process patterns.

Figure 4:
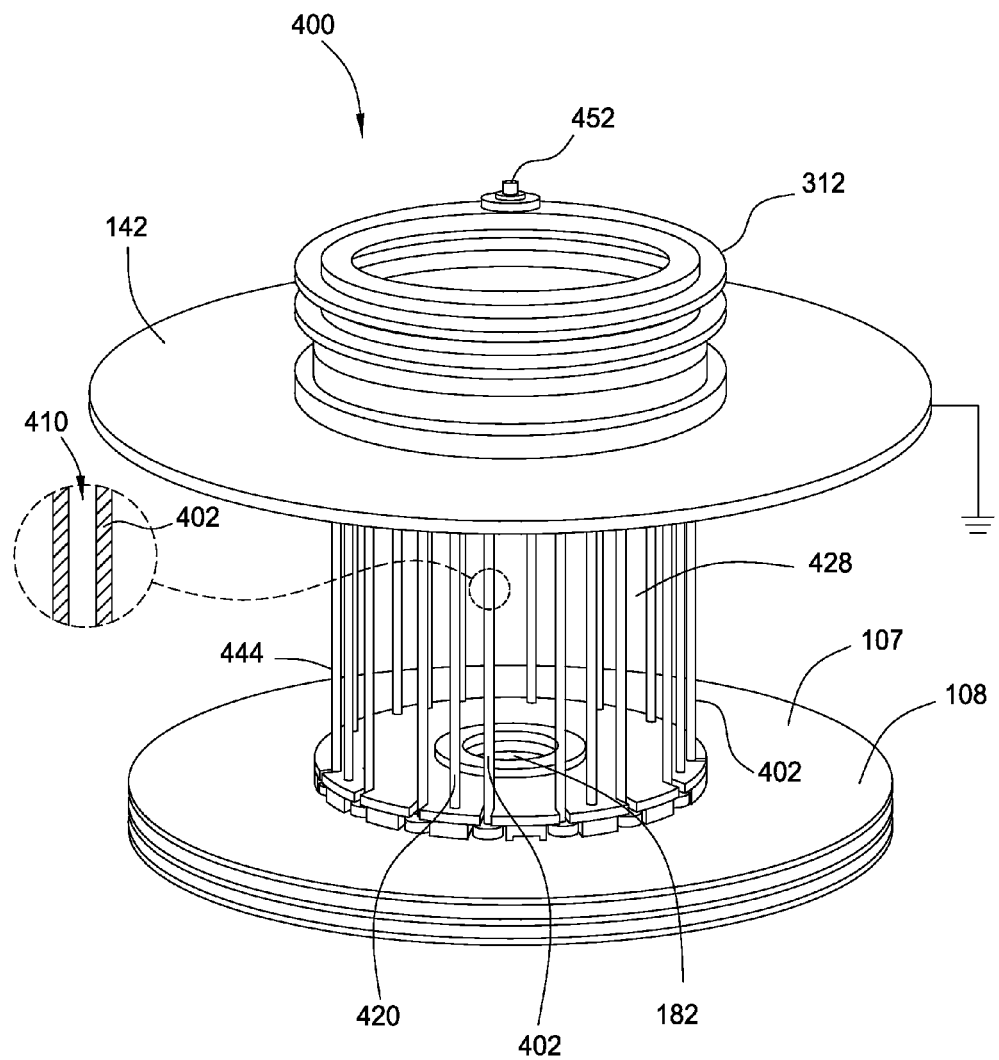
FIG. 4 illustrates a partial isometric view for another integrated gas and coil assembly.

FIG. 4 illustrates a partial isometric view for another embodiment of an integrated gas and coil assembly 400. The integrated gas and coil assembly 400 is similar to the integrated gas and coil assembly 140 shown in FIG. 2 except the isolator rings 212, 214, 216, 218 of the outer isolator 144 is replaced with a plurality of closely spaced isolators 402 that define an outer isolator 444 between the ground plate 142 and the lid 108.

Figure 5:
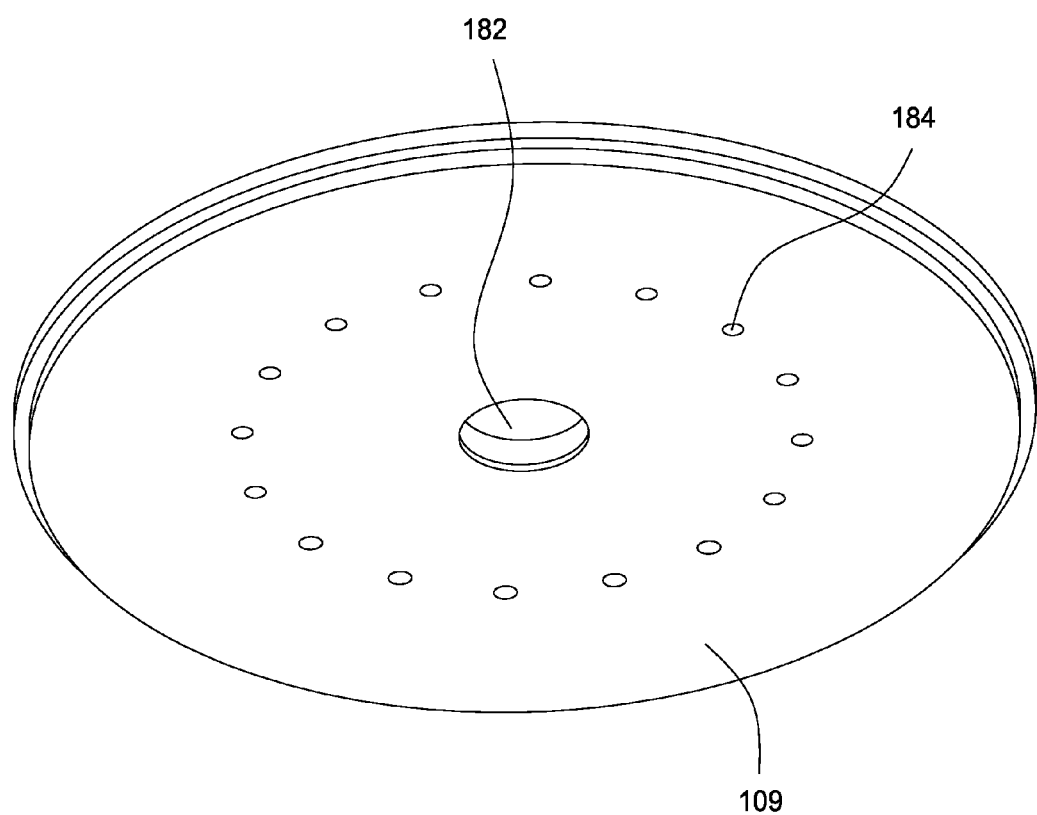
FIG. 5 illustrates an isometric view for a pattern of outer gas nozzles as seen on a bottom surface of a chamber lid.

All or at least some of the isolators 402 have gas feeds 410 disposed therethrough for connecting to the outer gas nozzles 184 in the lid 108 as additionally shown in FIG. 5. The isolators 402 which do not have gas feeds 410 can also be referred to as isolation posts 420. Additionally, the outer isolator 444 may have one or more isolator rings 312 disposed atop the ground plate 142 for evenly distributing the process gas to each of the gas feeds 410. Process gas entering an inlet port 452 may be divided using a gas feeding channel 250 (not shown in FIG. 4) in a manner similar to that discussed above in connection with FIG. 3. The isolator rings 312 may have a number of outlets (not shown) configured to interface with each gas feed 410 for routing the process gas to the nozzles 184 formed in the lid 108. Alternately, a mixing box, manifold or other suitable device may be employed to provide an even distribution of the process gasses to each of the inlets for the gas feeds 410.

The gas feeds 410 and isolation posts 420 are disposed between the ground plate 142 and the lid 108. The outer isolator 444 may have one or more voids or spaces 428 formed between adjacent gas feeds 410 and/or isolation posts 420. The spaces 428 may extend from the upper surface 109 of the lid 108 to the ground plate 142. The size of the spaces 428, i.e., the distance between adjacent gas feeds 410 and/or isolation posts 420, are selected to prevent crosstalk between the RF fields of the inner RF coil 121 and the outer RF coil 120. The spaces 428 provide a break along the surface of the outer isolator 444 for preventing the formation of eddy currents. The integrated gas and coil assembly 400 may be more energy efficient by preventing eddy currents, which rob power from the plasma reactor 100. The spaces 420 formed in the outer isolator 444 also allows more efficient cooling of the plasma applicator 150.

The gas feeds 410 and isolation posts 420 may be arranged in any pattern sufficient to provide RF isolation between the coils 120, 121. The pattern for the gas feeds 410, and hence the outer gas nozzles 184 in the lid 108, may be configured to provide symmetric injection of feedstock gases into the internal volume 124 of the plasma reactor 100.

Figure 6:
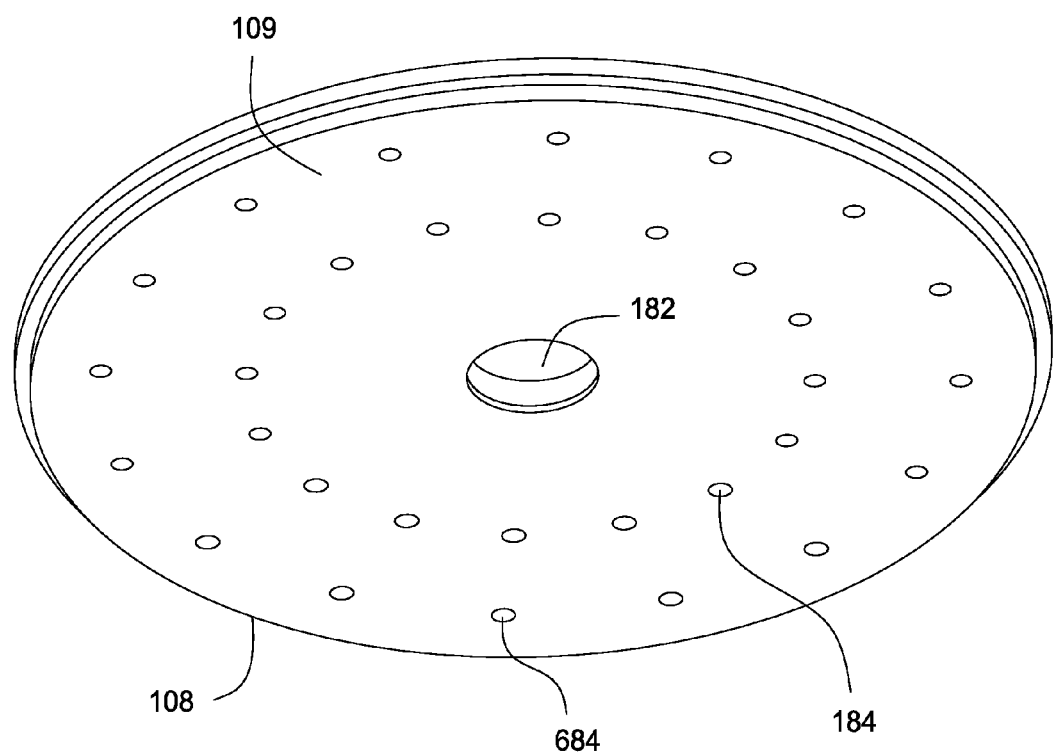
FIG. 6 illustrates an isometric view for another pattern of the outer gas nozzles as seen on the bottom surface of the chamber lid.

It should be appreciated that the pattern formed for the outer gas nozzles 184 in the lid 108 using the integrated gas and coil assembly 400 may appear substantially similar to that of integrated gas and coil assembly 140. That is, the patter placement of nozzles 184 in the lid 108 may be replicated with either of integrated gas and coil assembly 140, 400. FIG. 5 and FIG. 6 show example patterns for the outer gas nozzles 184 in the lid 108.

FIG. 5 illustrates an isometric view for a pattern of the outer gas nozzles 184 disposed on the lower surface 107 of the chamber lid 108. The pattern of the outer gas nozzles 184 is radially symmetric about the center gas nozzle 182. Although the pattern of outer gas nozzles 184 shown is circular, the pattern may be of any desired shape or configuration which will yield desired substrate processing results.

FIG. 6 illustrates an isometric view for another pattern of the outer gas nozzles 184 disposed on the lower surface 107 of the chamber lid 108. A plurality of second outer gas nozzles 684 are radially symmetric about the outer gas nozzles 184 which in turn are radially symmetric about the center gas nozzle 182. Thus, FIG. 6 shows the center zone, the outer zone and a second outer zone for feedstock gas injection into the plasma reactor 100. The number of the outer gas nozzles 184 may or may not be equal to the number of the second outer gas nozzles 684. The pattern may be formed with the addition of a second outer RF coil and a second outer isolator to either of the integrated Gas and Coil Assemblies 140, 400 shown in FIG. 2 or FIG. 4. It should be appreciated that FIG. 6 is illustrative and any number of zones for feedstock gas injection may be created by configuring the integrated Gas and Coil Assembly with additional RF coils and isolators having gas channels.

Figure 7:
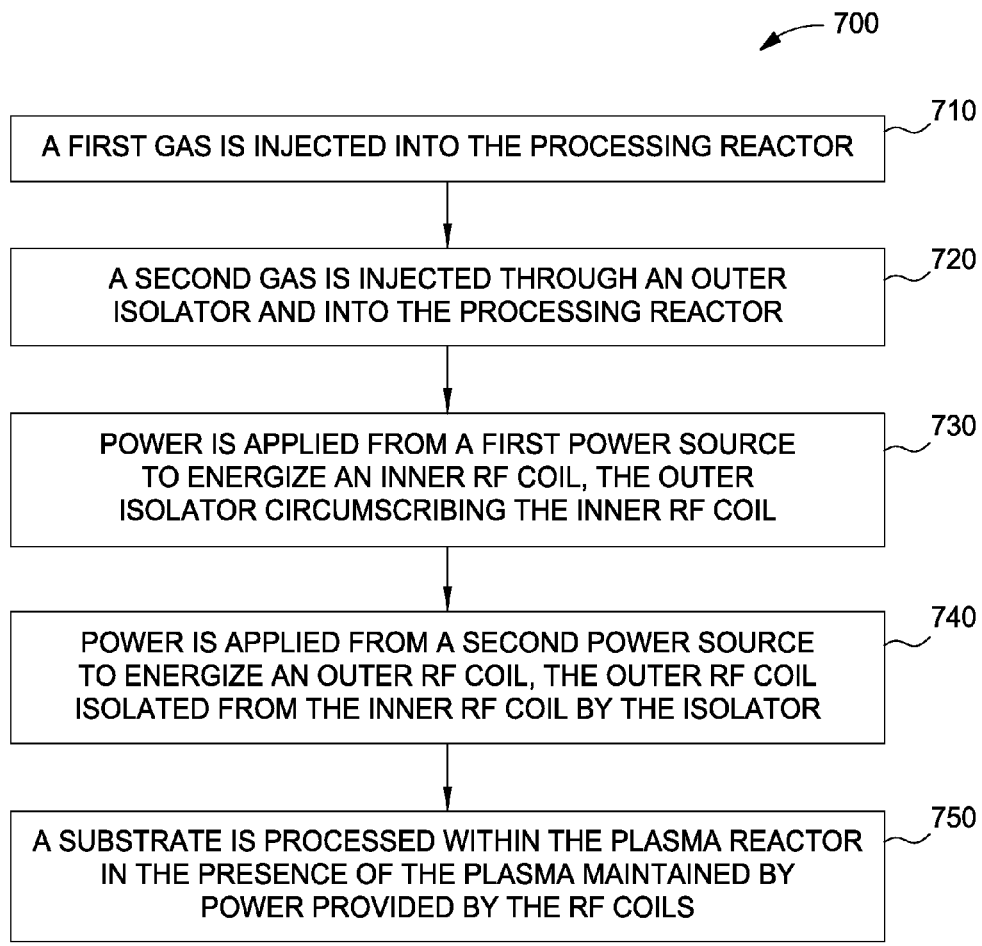
FIG. 7 is a flow diagram for a method for processing a substrate utilizing multiple zone gas injection in an inductively coupled plasma reactor.

FIG. 7 is a flow diagram of one embodiment for a method 700 for processing a substrate utilizing multiple zone gas injection in an inductively coupled plasma reactor. At block 710, a first gas is injecting through a center isolator into the plasma reactor.

At block 720, a second gas is injecting through a plurality of gas flooding channels into the plasma reactor. The second gas and the first gas may be the same in certain embodiments.

At block 730, power from a first power source is applied to energize an inner RF coil. At block 740, power from a second power source is applied to energize an outer RF coil. The outer RF coil and the inner RF coil are isolated from each other by an outer isolator disposed between the coils while forming a plasma from the gases in the plasma reactor. At least the second gases in the gas channels disposed through the outer isolator are isolated from the RF energy generated by the outer RF coil and the inner RF coil.

At block 750 a substrate is processes within the plasma reactor in the presence of the plasma. In one embodiment, the substrate is etched while processing. In another embodiment a layer of material is deposited on the substrate while processing.

Although the embodiments described above include many features demonstrating advantages over a conventional gas and coil assembly, such features also individually provide novel advantages over the prior art. In first example, some embodiments of the gas and coil assembly only need to have the outer isolator to provide the benefit of electromagnetically shielding the inner and outer coils to prevent crosstalk between the inner and outer coils thus enabling the creation of separately controllable plasma zones in the plasma reactor. Such embodiments can optionally rely on conventional gas delivery techniques. In a second example, some embodiments of the gas and coil assembly need only have a shielded gas delivery which provides an RF field-free passage for delivering gas to the processing chamber. Such embodiments can optionally rely on coil isolation techniques such as described above. In yet a third example, some embodiments of the gas and coil assembly need only have reciprocating gas channels within the isolator rings for distributing the feedstock gas from one or more gas lines through the gas channels in the isolator rings and symmetrically out a plurality of nozzles in the plasma reactor. Such embodiments can optionally rely on coil isolation and/or shielded gas delivery techniques. In still another, some embodiments of the gas and coil assembly need only have unshielded portions of the gas lines disposed above a ground plate positioned atop RF coils utilized to energize gases within the plasma reactor. The unshielded portions of the gas lines are electromagnetically shielded by the ground plate and thus substantially outside the influence of RF coils. Such embodiments can optionally rely on any one or more of coil isolation, reciprocating gas channels and/or shielded gas delivery techniques.

While the foregoing is directed to implementations of the present invention, other and further implementations of the invention may be devised without departing from the basic scope thereof, and the scope thereof is determined by the claims that follow.

We claim:

1. An integrated gas and coil assembly, comprising:
   a first RF coil;
   a second RF coil circumscribed by the first RF coil;
   an outer RF isolator disposed between the first and second RF coil, wherein the outer RF isolator circumscribes the inner coil and electromagnetically shields the inner coil from the outer coil; and
   at least one gas channel disposed through the outer RF isolator.

2. The integrated gas and coil assembly of claim 1 further comprising:
   a ground plate is disposed above the coils, the ground plate electrically bonded to the outer RF isolator.

3. The integrated gas and coil assembly of claim 1 further comprising:
   a first RF power source coupled to the first RF coil; and
   a second RF power source coupled to the second RF coil at a second RF frequency.

4. The integrated gas and coil assembly of claim 3, wherein the first RF power source is operable at a tunable frequency.

5. The integrated gas and coil assembly of claim 2, wherein the outer RF isolator comprises:
   a plurality of isolator rings.

6. The integrated gas and coil assembly of claim 5, wherein the isolator rings comprises a gas feeding channel having a plurality of tees.

7. The integrated gas and coil assembly of claim 1, wherein the outer RF isolator comprises:
   a plurality of isolation posts having no gas channels disposed therethrough.

8. The integrated gas and coil assembly of claim 1, wherein the outer RF isolator comprises:
   a plurality of isolators spaced to provide an RF shield.

9. The integrated gas and coil assembly of claim 1, further comprising:
   a center isolator circumscribed by the inner RF coil.

10. A plasma processing reactor comprising:
    a chamber body;
    a lid disposed on the chamber body
    a substrate support disposed in the chamber body; and
    an integrated gas and coil assembly, wherein the integrated gas and coil assembly comprises:
    a first RF coil;

a second RF coil circumscribed by the first RF coil;

an outer RF isolator disposed between the first and second RF coil, wherein the outer RF isolator circumscribes the inner coil and electromagnetically shields the inner coil from the outer coil; and at least one gas channel disposed through the outer RF isolator.

11. The processing chamber of claim 10 further comprising:

a ground plate disposed and electrically bonded to the outer RF isolator above the coils.

12. The processing chamber of claim 10, further comprising:

a first RF power source coupled to the first RF coil; and a second RF power source coupled to the second RF coil at a second RF frequency.

13. The processing chamber of claim 12, wherein the first RF power source is operable at a tunable frequency.

14. The processing chamber of claim 11, wherein the RF isolator is comprised of:

a plurality of isolator rings having reciprocal gas feeding channels.

15. The processing chamber of claim 10, wherein the RF isolator is comprised of:

a plurality of isolators spaced to provide an RF shield.

16. The processing chamber of claim 15, further comprising:

a plurality of isolation posts having no gas channels disposed therethrough.

17. A method for processing a substrate in a processing reactor, comprising:

injecting a first gas into the processing reactor;

injecting second gases through an outer isolator and into the processing reactor;

applying power from a first power source to energize an inner RF coil the outer isolator circumscribing the inner RF coil;

applying power from a second power source to energize an outer RF coil, the outer RF coil electromagnetically isolated from the inner RF coil by the isolator; and processing a substrate in the processing reactor in the presence of a plasma maintained by power provided to the RF coils.

18. The method of claim 17, wherein the first power source and the second power source operate on separate frequencies.

19. The method of claim 18, wherein energizing the inner RF coil inductively couples RF energy of a first frequency to the plasma and energizing the outer RF coil inductively couples RF energy of a second frequency to the plasma.

20. The method of claim 19, wherein processing the substrate comprises etching or depositing a layer or material on the substrate.

* * * * *